(12) United States Patent
Hasegawa et al.

(10) Patent No.: US 11,002,687 B2
(45) Date of Patent: May 11, 2021

(54) DEFECT INSPECTION METHOD AND DEFECT INSPECTION DEVICE

(71) Applicant: Hitachi High-Tech Corporation, Tokyo (JP)

(72) Inventors: Masaki Hasegawa, Tokyo (JP); Katsunori Onuki, Tokyo (JP); Noriyuki Kaneoka, Tokyo (JP); Hisaya Murakoshi, Tokyo (JP); Tomohiko Ogata, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 297 days.

(21) Appl. No.: 16/084,155

(22) PCT Filed: Mar. 16, 2016

(86) PCT No.: PCT/JP2016/058230
§ 371 (c)(1),
(2) Date: Sep. 11, 2018

(87) PCT Pub. No.: WO2017/158744
PCT Pub. Date: Sep. 21, 2017

(65) Prior Publication Data
US 2020/0292466 A1    Sep. 17, 2020

(51) Int. Cl.
*G01N 21/94*        (2006.01)
*G01N 23/2251*    (2018.01)
*H01J 37/28*        (2006.01)

(52) U.S. Cl.
CPC ......... *G01N 21/94* (2013.01); *G01N 23/2251* (2013.01); *H01J 37/28* (2013.01); *H01J 2237/2813* (2013.01)

(58) Field of Classification Search
CPC .. G01N 21/94; G01N 23/2251; G01N 23/203; G01N 21/8806; G01N 23/225;
(Continued)

(56) References Cited

U.S. PATENT DOCUMENTS 5,487,172 A * 1/1996 Hyatt .................. B60R 16/0373
                                                                   712/32
5,502,306 A * 3/1996 Meisburger .......... G01R 31/307
                                                                   250/307

(Continued)

FOREIGN PATENT DOCUMENTS

JP          3534582 B2      6/2004
JP        2004-298996 A    10/2004
(Continued)

OTHER PUBLICATIONS

International Search Report (PCT/ISA/210) issued in PCT Application No. PCT/JP2016/058230 dated Jun. 7, 2016 with English translation (four (4) pages).
(Continued)

*Primary Examiner* — Mohamed K Amara
(74) *Attorney, Agent, or Firm* — Crowell & Moring LLP

(57) ABSTRACT

A defect inspection device includes a sample support member, a negative voltage, an imaging element, an ultraviolet light source, a movement stage, and a control device. The control device controls the movement stage such that a portion of a linear part included in the image or a location on an extensional line of the linear part is positioned at a specific location in an irradiated region of the electron beam. The control device also repeats the control of the movement stage until an end of the linear part is positioned within the irradiated region of the electron beam.

10 Claims, 14 Drawing Sheets

(58) Field of Classification Search
CPC ....... G01N 21/956; G01N 21/47; H01J 37/28; H01J 2237/2813; H01J 37/244; H01J 2237/2817; H01J 37/20; H01J 37/26; H01J 2237/24592; H01J 37/153; H01J 2237/24475

See application file for complete search history.

(56) References Cited

U.S. PATENT DOCUMENTS

| | | | | |
|---|---|---|---|---|
| 6,177,681 | B1* | 1/2001 | Nakamura | G01N 21/9501 250/341.4 |
| 6,465,781 | B1* | 10/2002 | Nishimura | H01J 37/026 250/305 |
| 6,797,954 | B2* | 9/2004 | Shinada | H01J 37/244 850/10 |
| 6,878,937 | B1* | 4/2005 | Mankos | G01N 23/203 250/306 |
| 7,288,948 | B2* | 10/2007 | Hasegawa | G01N 23/225 324/754.22 |
| 7,566,872 | B2* | 7/2009 | Fukaya | H01J 37/28 134/1 |
| 8,169,454 | B1* | 5/2012 | Hajjar | H04N 9/3129 347/235 |
| 9,536,697 | B2* | 1/2017 | Wang | H01J 37/026 |
| 2003/0047682 | A1* | 3/2003 | Hatakeyama | G01N 21/9501 250/310 |
| 2003/0094572 | A1* | 5/2003 | Matsui | H01J 37/28 250/310 |
| 2003/0127593 | A1* | 7/2003 | Shinada | H01J 37/29 250/310 |
| 2004/0193305 | A1 | 9/2004 | Hayashi | |
| 2004/0222377 | A1 | 11/2004 | Shinada et al. | |
| 2006/0011835 | A1* | 1/2006 | Murakoshi | H01J 37/147 250/310 |
| 2007/0085005 | A1* | 4/2007 | Hasegawa | H01J 37/026 250/310 |
| 2007/0181808 | A1* | 8/2007 | Murakoshi | H01J 37/29 250/310 |
| 2007/0194229 | A1* | 8/2007 | Okuda | H01J 37/292 250/310 |
| 2007/0272857 | A1* | 11/2007 | Hasegawa | H01J 37/29 250/307 |
| 2008/0182041 | A1* | 7/2008 | Sekine | G06F 3/0421 428/29 |
| 2008/0315093 | A1* | 12/2008 | Hasegawa | G01N 23/225 250/310 |
| 2009/0279170 | A1* | 11/2009 | Miyazaki | G06F 3/041 359/485.01 |
| 2010/0181480 | A1* | 7/2010 | Shimakura | H01J 37/026 250/310 |
| 2014/0084159 | A1 | 3/2014 | Yaeshima et al. | |
| 2015/0146967 | A1* | 5/2015 | Miyamoto | H01J 37/28 382/145 |
| 2017/0102467 | A1* | 4/2017 | Nielsen | G01S 19/47 |

FOREIGN PATENT DOCUMENTS

| | | |
|---|---|---|
| JP | 2012-242146 A | 12/2012 |
| WO | WO 2016/002003 A1 | 1/2016 |

OTHER PUBLICATIONS

Japanese-language Written Opinion (PCT/ISA/237) issued in PCT Application No. PCT/JP2016/058230 dated Jun. 7, 2016 (three (3) pages.).

Hasegawa et al., "Non-Destructive Observation of In-Grown Stacking Faults in 4H-SiC Epitaxial Layer Using Mirror Electron Microscope", Journal of Applied Physics, 2011, vol. 10, No. 073507, Tokyo, JP, (six (6) pages).

Shinada et al., "Mirror Electron Microscope Technology Having Possibilities of High-Speed and Highly Sensitive Inspection", Hitachi Hyoron, Feb. 1, 2012, vol. 94, No. 2, pp. 198-203, with English abstract, (seven (7) pages).

Isshiki et al., "Observation of Basal Plane Dislocation in 4H-SiC Wafer by Mirror Projection Electron Microscopy and Low-Energy SEM", The 76$^{th}$ JSAP Autumn Meeting Koen Yokoshu, Aug. 31, 2015, (one (1) page).

* cited by examiner

[FIG. 1]
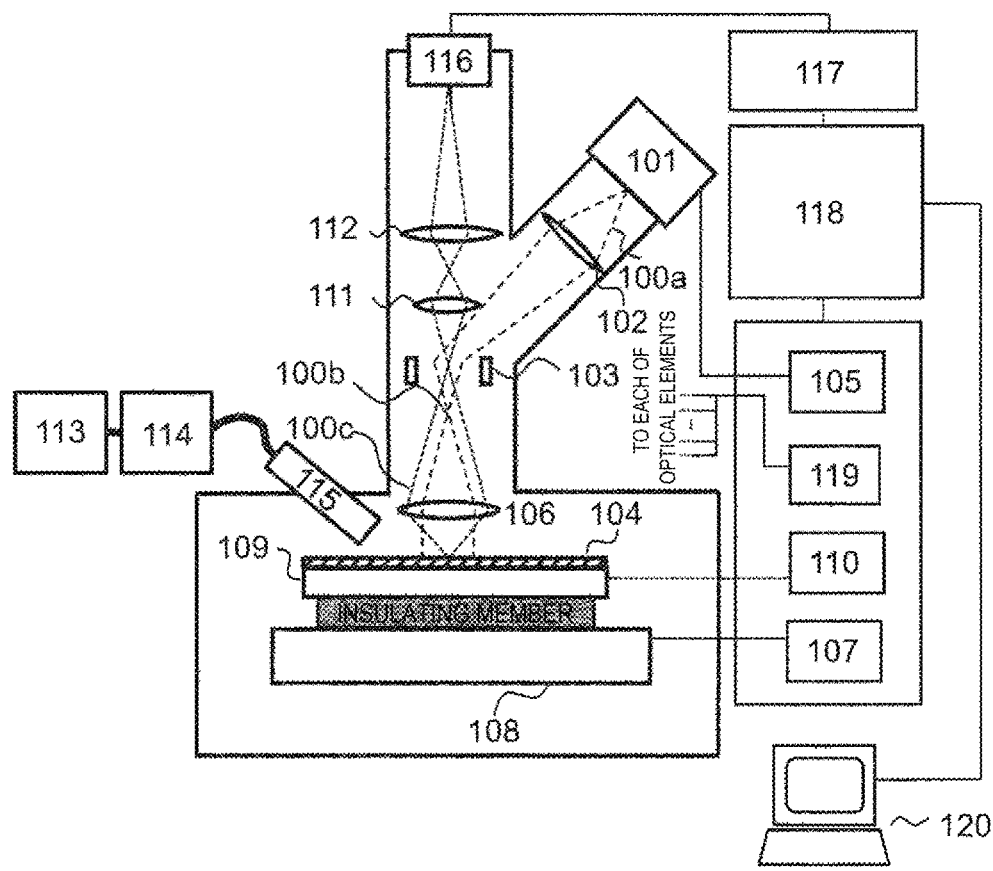

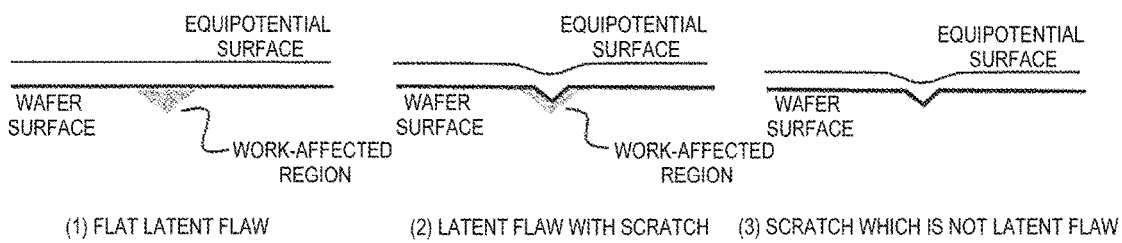
[FIG. 2A] SECTION OF WAFER SURFACE IN STATE OF NOT BEING IRRADIATED WITH ULTRAVIOLET RAY
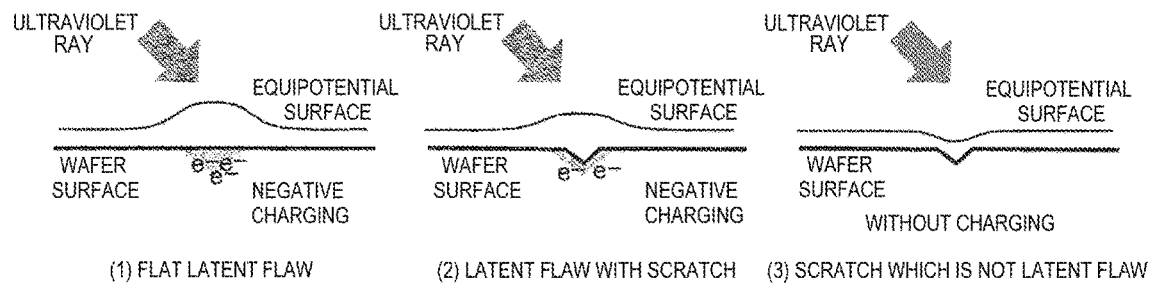
[FIG. 2B] STATE OF BEING IRRADIATED WITH ULTRAVIOLET RAY

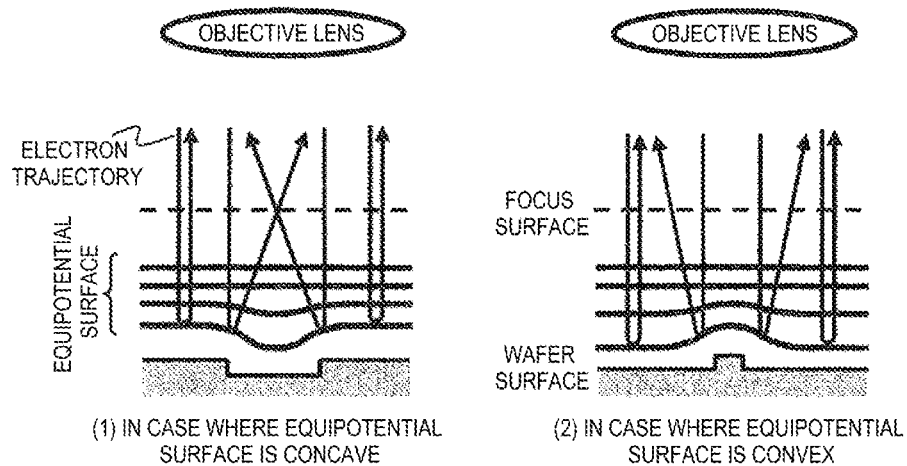
[FIG. 3A] IN CASE OF UNEVEN SHAPE
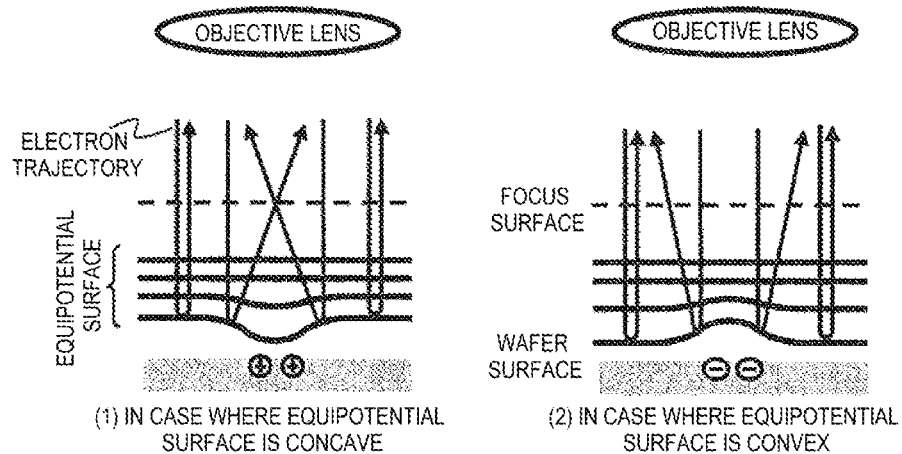
[FIG. 3B] IN CASE OF LOCAL CHARGING

[FIG. 4]
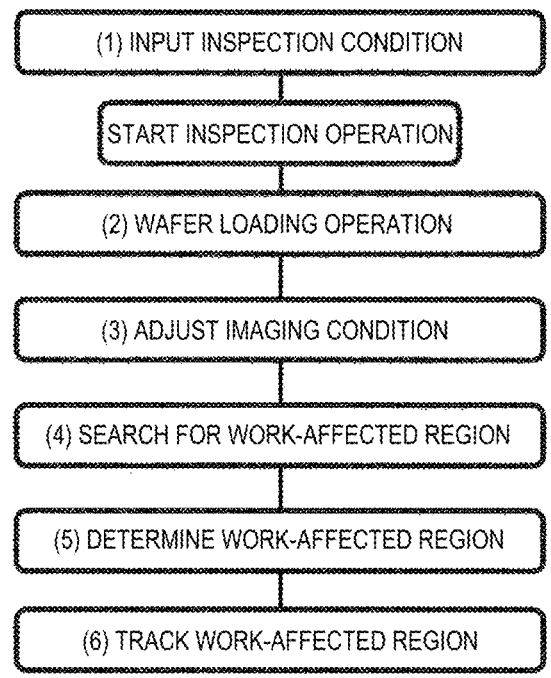

[FIG. 5A] MIRROR ELECTRON IMAGE HAVING WORK-AFFECTED REGION
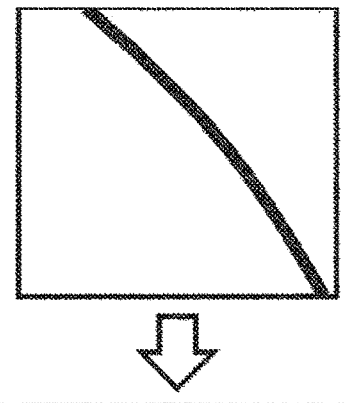
CHANGE ULTRAVIOLET IRRADIATION CONDITION
[FIG. 5B]
TYPE OF MIRROR ELECTRON IMAGE AFTER CHANGING ULTRAVIOLET IRRADIATION CONDITION
| MIRROR ELECTRON IMAGE 1 | MIRROR ELECTRON IMAGE 2 | MIRROR ELECTRON IMAGE 3 | MIRROR ELECTRON IMAGE 4 |
|---|---|---|---|
| 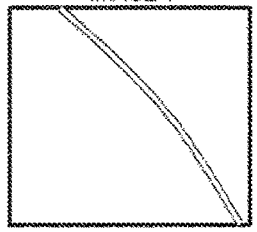 | 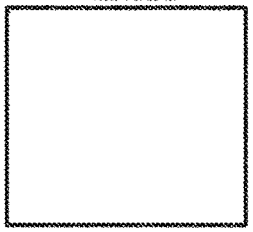 | 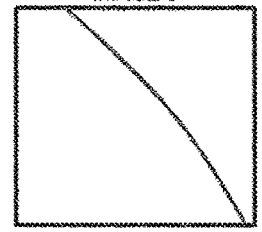 | 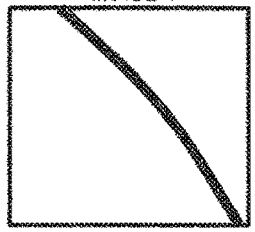 |

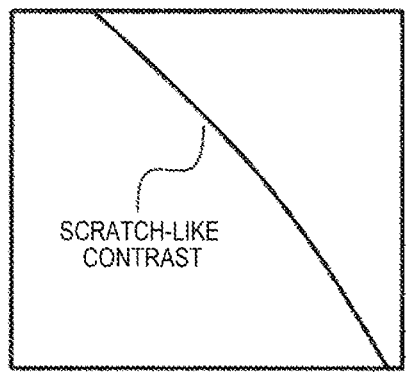
[FIG. 6A]   EXAMPLE OF SCRATCH-LIKE CONTRAST
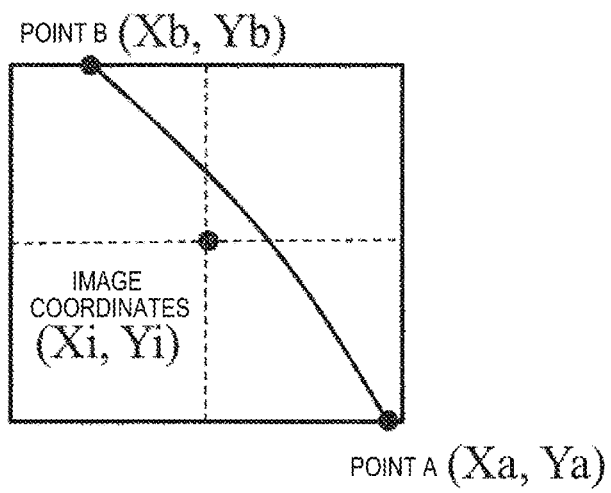
[FIG. 6B]   FEATURE POINT

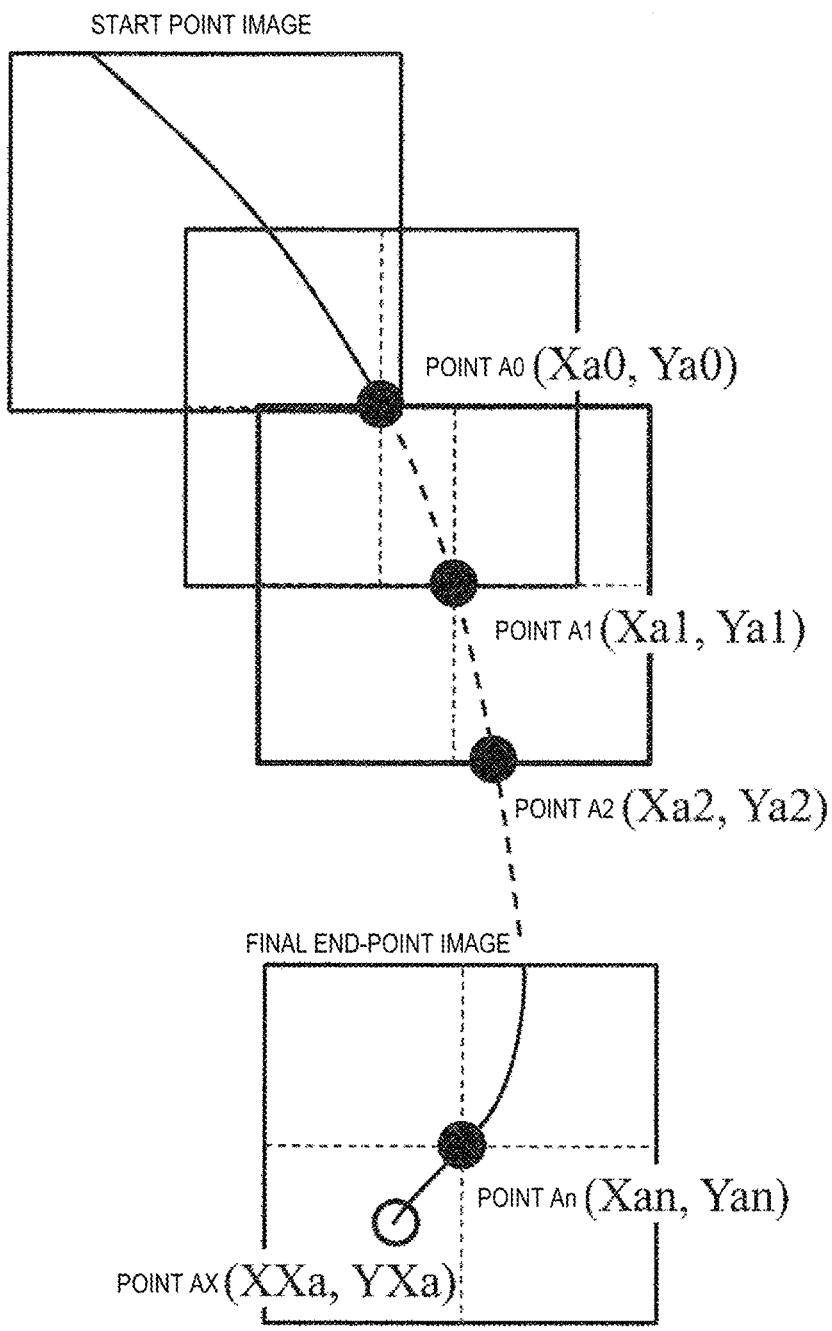

[FIG. 8]
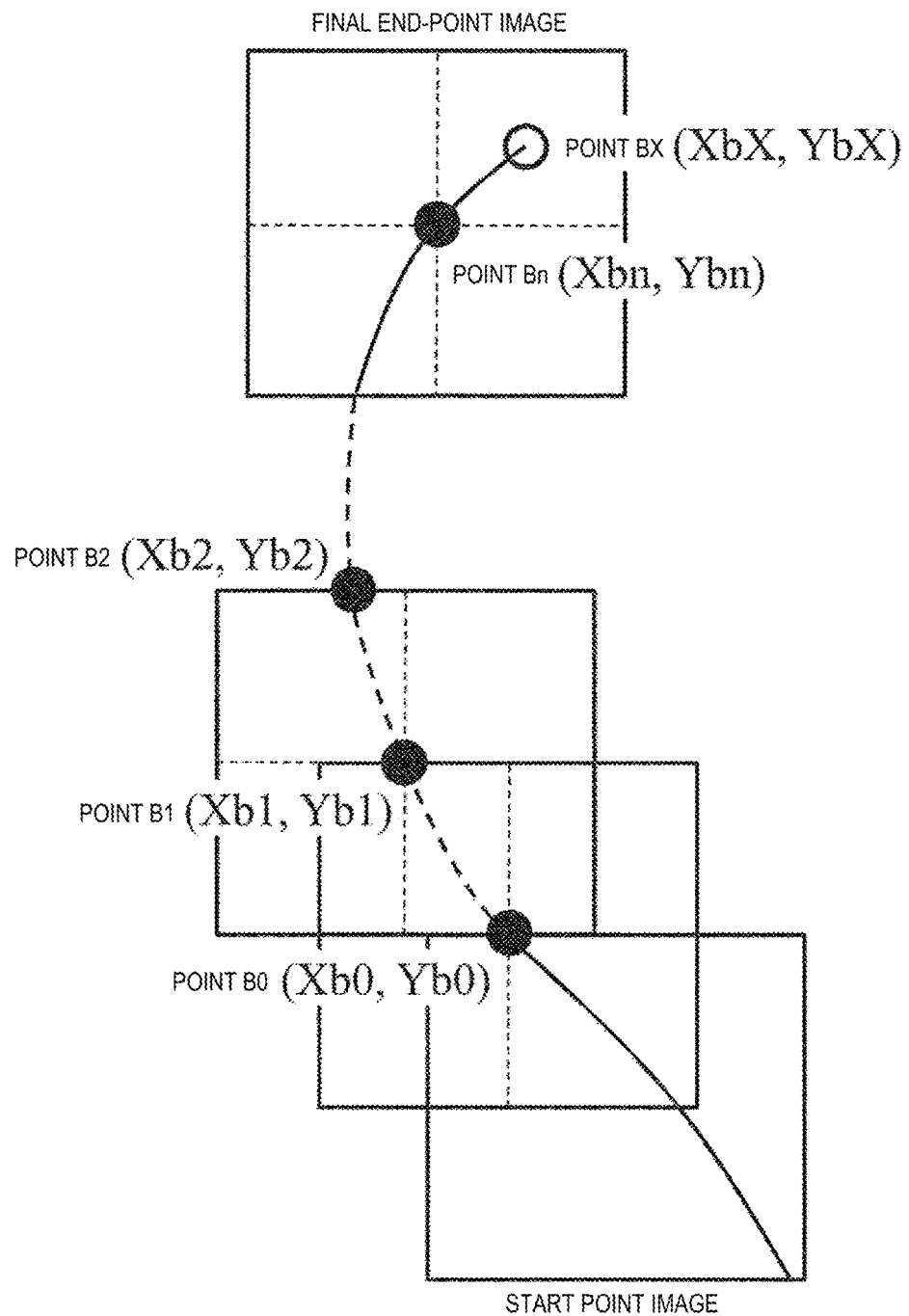

[FIG. 9]
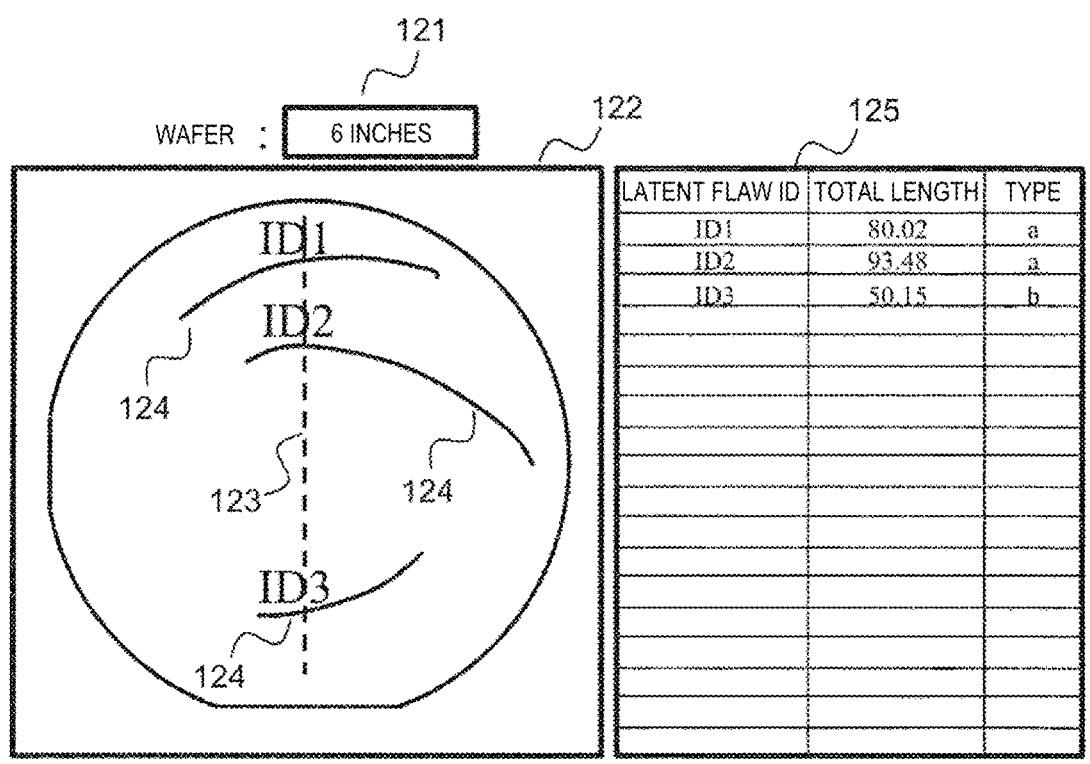

[FIG. 10]
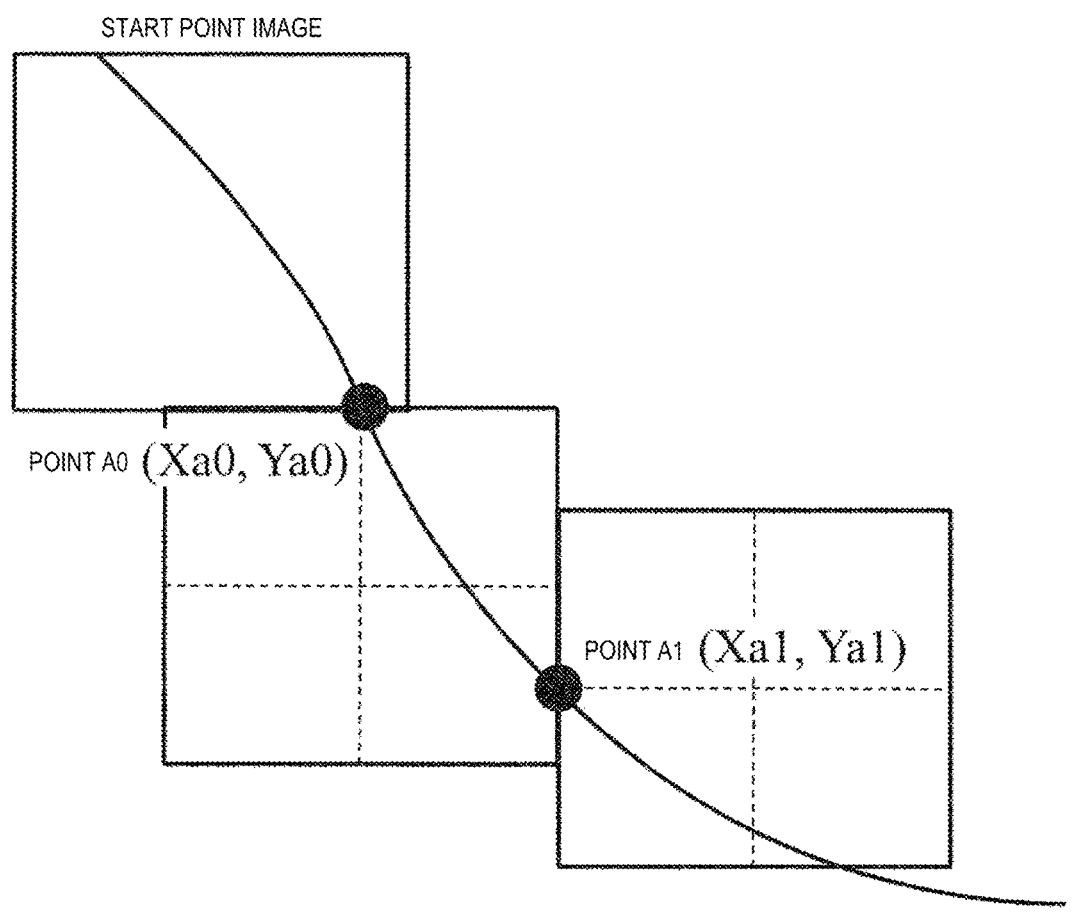

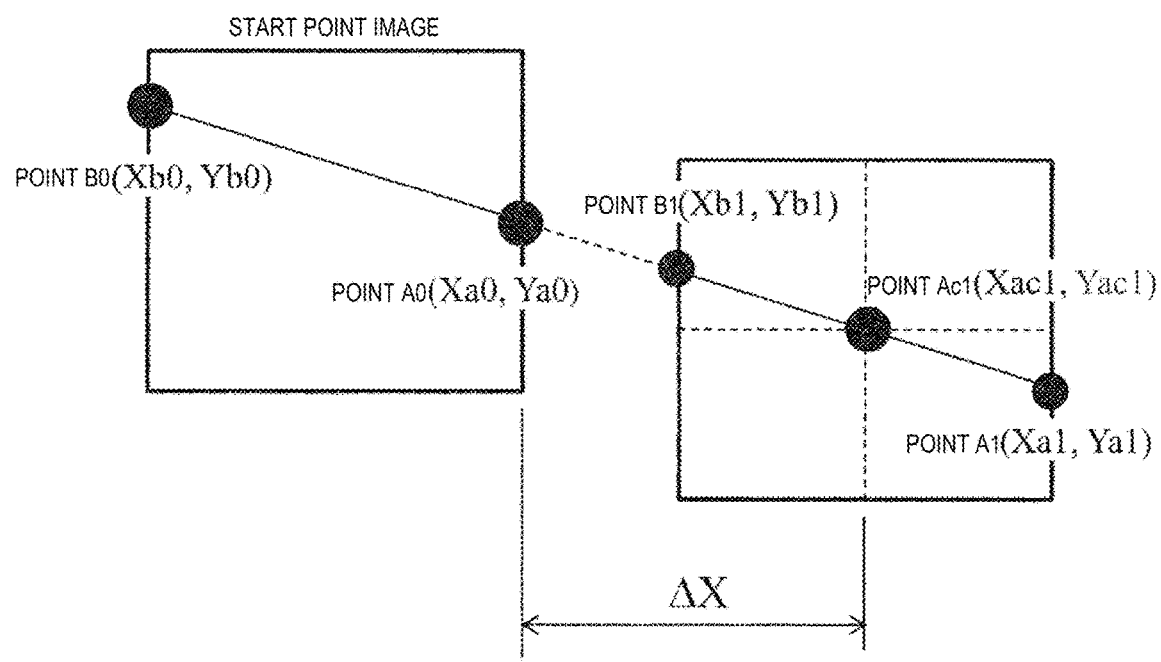
[FIG. 11]

[FIG. 12]
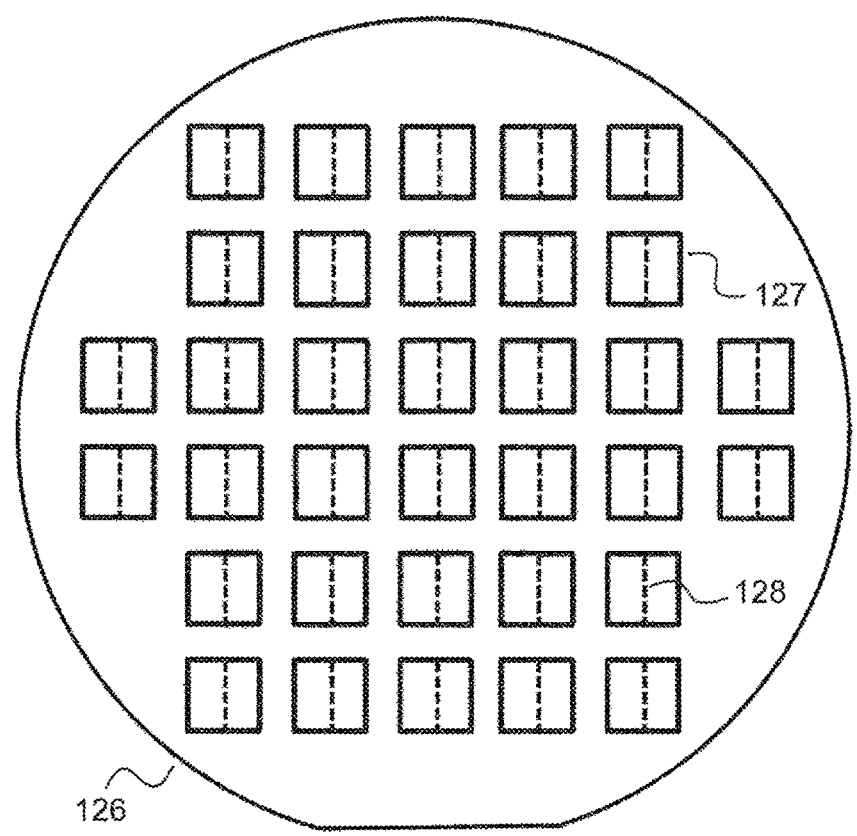

[FIG. 13]
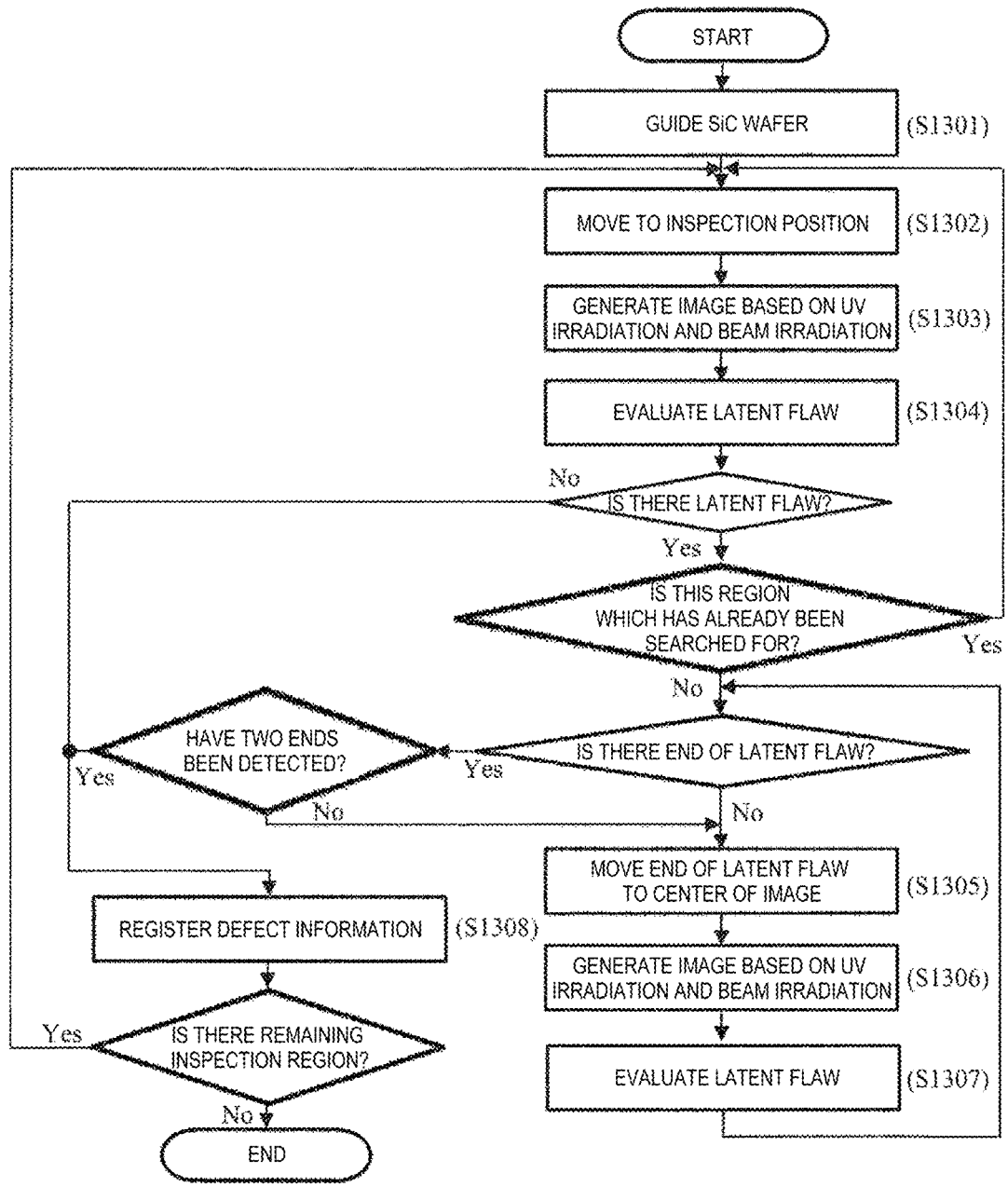

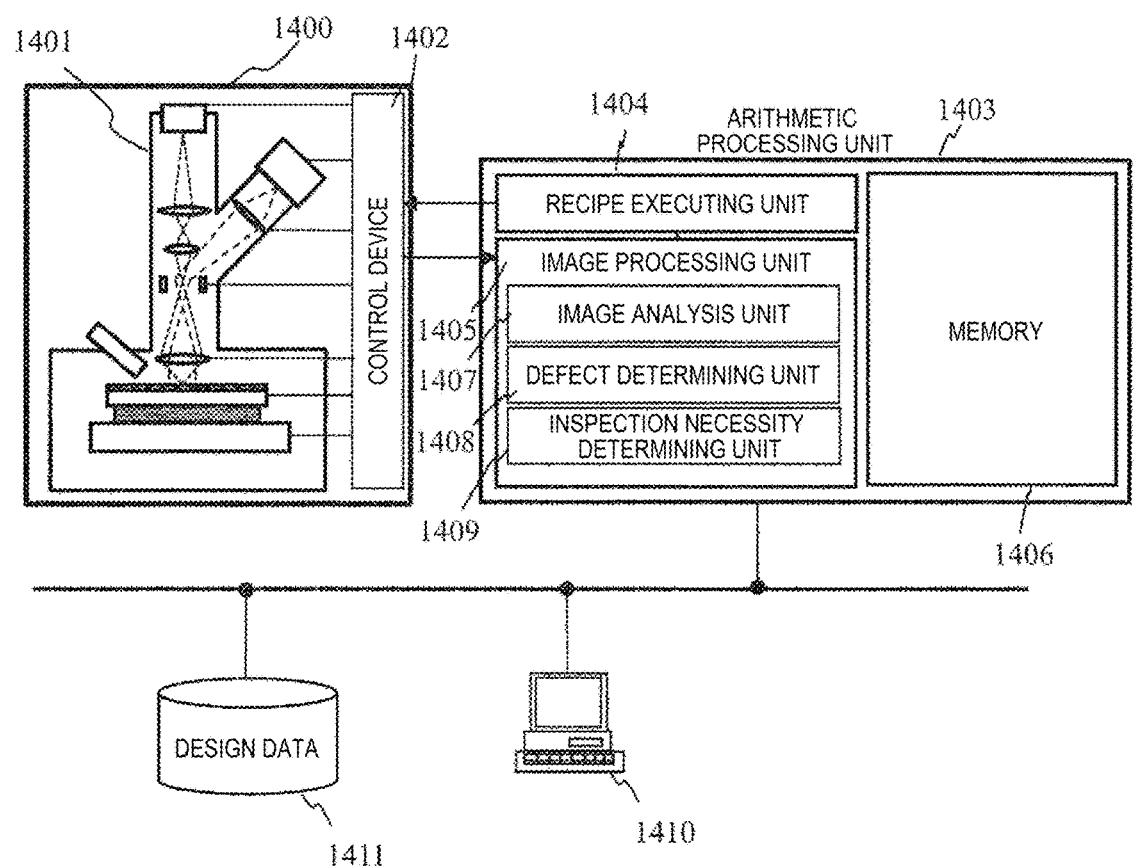

DEFECT INSPECTION METHOD AND DEFECT INSPECTION DEVICE

TECHNICAL FIELD

The present invention relates to a wafer defect inspection method and a defect inspection device, and more particularly to a method and a device for inspecting a defect based on an image formed based on charged particle irradiation.

BACKGROUND ART

An electron beam device for evaluating an image formed by detecting an electron obtained by irradiating a sample with a charged particle beam is used for defect inspection of a wafer. PTL 1 discloses a defect inspection device that detects a defect based on an image signal obtained based on electron beam irradiation. PTL 1 discloses a device in which a negative voltage close to an accelerating voltage of an electron beam to be emitted is applied to the wafer to invert the electron beam emitted to the entire inspection field on the wafer surface in the vicinity of the wafer surface, and the inverted electron beam forms an image by an electron lens to obtain an electron image for inspection. An image can be formed by imaging the inverted electrons (mirror electrons).

Further, as a use of such a mirror electron microscope, detection of a defect in a semiconductor crystal is described in NPTL 1. In NPTL 1 describes that a mirror electron image obtained in a state of being irradiated with an ultraviolet ray is appropriate for detecting a stacking fault of an SiC epitaxial layer. A charge generated inside the sample by ultraviolet irradiation is trapped at a stacking fault part of the SiC epitaxial layer and is locally charged to distort an equipotential surface of the surface. Even with slight equipotential surface distortion, a distinguishable contrast appears in the mirror electron image, and thus, the stacking fault can be detected with high sensitivity using the mirror electron microscope.

CITATION LIST

Patent Literature

PTL 1: Japanese Patent No. 3534582 (corresponding U.S. Pat. No. 6,979,823)

Non-Patent Literature

NPTL 1: M. Hasegawa and T. Ohno, J. Appl. Phys., 110, 073507 (2011)

SUMMARY OF INVENTION

Technical Problem

In a semiconductor device manufacturing process, a fine circuit is formed on a semiconductor wafer polished in shape of a mirror. When foreign substances, scratches, crystal defects, or affected layers of crystals exist on such a wafer, defects or material deterioration occur in the process of forming a circuit pattern, the manufactured device does not operate normally, reliability of the operation deteriorates, and thus, completion as a product is not achieved.

In a case of a power device using SiC as described above, although SiC is excellent as a power device material in characteristics, such as a dielectric breakdown withstand voltage, compared to Si which is a semiconductor used in the related art, SiC is excellent in chemical stability and hard, and thus, it is difficult to process into the wafer shape and polish.

Prior to forming the device pattern on the SiC wafer, a SiC epitaxial layer is formed. Although the wafer is mirror-finished by mechanical polishing, it is necessary to prepare a flat and disturbance-free crystal surface on an atomic level by further performing chemical mechanical polishing (CMP) is further performed, and removing the work-affected layer generated by the mechanical polishing. However, it is difficult to set the optimum time for the CMP process, and there is also a case where the work-affected region generated by the mechanical polishing remains in the surface or a case where extremely minute scratches are formed. In a case where the surface of the remaining work-affected region is flat, or in a case where the size of the scratches is small, it is difficult to detect the work-affected region or the scratches. Hereinafter, such an affected region or scratches will be referred to as "latent flaw".

When the epitaxial layers are grown on the wafer surface where the latent flaws remain, there is a case where abnormalities occur in an atomic step starting from the latent flaws and large uneven structures are formed. When the devices are formed on the surface where such unevenness is formed on the surface, the voltage breakdown strength remarkably deteriorates, and thus, the device cannot be used as a power device. Therefore, it is extremely important to inspect whether or not the latent flaw remains.

Meanwhile, the latent flaw is a defect having a length of several mm to several tens of mm. Meanwhile, in order to perform high-precision defect detection by the electron microscope, it is necessary to obtain a high-magnification image by reducing a size of a field of view (for example, 100 μm or less). In a locally charged state by ultraviolet irradiation disclosed in NPTL 1, by performing observation with a mirror microscope as disclosed in PTL 1, it is possible to manifest the defect, but PTL 1 and NPTL 1 do not mention high-precision evaluation of defects by acquiring a high-magnification image of a defect formed to be long.

Hereinafter, a defect inspection device for evaluating a long defect such as a latent flaw or the like with high precision will be suggested.

Solution to Problem

According to an aspect for achieving the above-described object, there is provided a defect inspection device including: a sample support member that supports a sample irradiated with an electron beam emitted from an electron source; a negative voltage applying power source for forming a retarding electric field with respect to the electron beam emitted toward the sample; an imaging element at which an image of electrons reflected without reaching the sample is formed via the retarding electric field; an ultraviolet light source that emits an ultraviolet light toward the sample; a movement stage that moves the sample support member; and a control device that controls the movement stage, in which the control device controls the movement stage such that a portion of a linear part included in the image or a location on an extensional line of the linear part is positioned at a specific location in an irradiated region of the electron beam, and repeats the control of the movement stage until an end of the linear part is positioned within the irradiated region of the electron beam.

Advantageous Effects of Invention

According to the above-described configuration, it becomes possible to evaluate long defects, such as latent flaws, with high precision.

BRIEF DESCRIPTION OF DRAWINGS

FIG. 1 is a view for describing an outline of a mirror electron microscope inspection device.

FIGS. 2A and 2B are views for describing charging of a work-affected region (latent flaw) generated by ultraviolet irradiation.

FIGS. 3A and 3B are views for describing a principle of contrast formation of a mirror electron microscope.

FIG. 4 is a flowchart illustrating an inspection process using the mirror electron microscope.

FIGS. 5A and 5B are views for describing a change in electron microscope image when ultraviolet irradiation conditions are changed.

FIGS. 6A and 6B are views illustrating an example of an image of a latent flaw and an image in which feature points for performing tracking inspection are extracted from the latent flaw image.

FIG. 7 is a view for describing a process of performing the tracking inspection to a latent flaw end with a position that corresponds to an image in which the latent flaw is detected as a start point.

FIG. 8 is a view for describing a process of performing the tracking inspection to the latent flaw end with the position that corresponds to the image in which the latent flaw is detected as a start point.

FIG. 9 is a view illustrating an example of a display screen for displaying a detection result of the latent flaw.

FIG. 10 is a view for describing a process of performing the tracking inspection to the latent flaw end with the position that corresponds to the image in which the latent flaw is detected as a start point.

FIG. 11 is a view for describing a process of performing the tracking inspection to the latent flaw end with the position that corresponds to the image in which the latent flaw is detected as a start point.

FIG. 12 is a view illustrating an example of a setting screen for setting device conditions for performing latent flaw search.

FIG. 13 is a flowchart illustrating a latent flaw search process.

FIG. 14 is a view illustrating an example of a defect inspection system including the mirror electron microscope.

DESCRIPTION OF EMBODIMENTS

An inspection device in which a technology (optical scattering type inspection technology) for detecting light scattered on a surface by irradiating a wafer surface with light having a certain wavelength of ultraviolet from visible (hereinafter, simply referred to as light), or an optical microscope technology, such as a dark field imaging, is employed as a wafer inspection technology, has been used. However, due to the progress of miniaturization of semiconductor elements and the like, in the inspection technology using the light in the related art, it is not possible to detect defects and quality control of a wafer may be hindered.

A work-affected region (latent flaw) underneath the wafer surface, which has a serious influence on formation of an epitaxial layer of SiC, could not be detected and managed by an optical inspection technique of the related art. Therefore, even when it is attempted to improve the process or to increase the speed of CMP process, it was not possible to determine an optimal process condition because there was no means for evaluating the presence or absence of latent flaws on the wafer surface and the existence density. As a result, technological development for improving wafer productivity was hindered and it was not possible to lower the unit price of SiC wafers.

Examples described below are related to a mirror electron microscope that can detect latent flaws and the like, and more particularly to a defect inspection device provided with a mirror electron microscope that can realize high speed or high precision of inspection. Since the impurity concentration of the SiC wafer prior to the formation of the epitaxial layer is higher than the impurity concentration of the epitaxial layer itself by approximately 10,000 to 100,000 times and the conductivity is high, even when it is attempted to charge the latent flaw by irradiation with an ultraviolet ray, it was considered that a charged electric charge was not held. However, in a case of latent flaws, the research by the inventors has confirmed that the existence region of the latent flaws is limited to the vicinity of the wafer surface, and thus, local charging is held for a sufficient period of time necessary for observation even when the impurity concentration of the wafer is high.

In the example described below, a defect inspection device which controls the movement stage such that an end of a linear part included in the image mainly imaged by the imaging element or a location on an extensional line of the linear part is positioned at a specific location of an irradiated region of an electron beam, is suggested. More specifically, while emitting the ultraviolet ray having a predetermined wavelength, a mirror electron microscope image of the wafer surface is acquired while moving a wafer stage on which the wafer is placed. The latent flaws are scratch-like defects in which the work-affected regions are linearly connected to each other. In a case where negative charging is performed by ultraviolet irradiation and a contrast indicating an equipotential surface with a convex-shaped scratch appears on the mirror electron microscope image, it is determined that there is a possibility of latent flaws.

Next, a wafer stage is moved and searches for a location where the contrast indicating the scratch discontinues along the contrast (linear part having a brightness different from that of the other parts) indicating the scratches in the mirror electron image (so as to have a brightness which is the same as that of a brightness displacement part included in the image and to trace the continuously connected brightness displacement parts even on the outside of the image). When the contrast discontinues, returning to the original position, the wafer stage is moved along the scratch-like contrast in the opposite direction, and searches for a contrast end point on the opposite side. By integrating bidirectional stage movement amounts or calculating the length of the brightness displacement part by image processing, the total length of the contrast indicating the scratch is recorded as defect data.

According to the above-described configuration, it is possible to measure the position and the total length of the latent flaw with respect to the wafer surface before the epitaxial layer growth, and it is possible to appropriately evaluate the wafer surface state after the CMP process. By performing the evaluation, it becomes possible to optimize the CMP process, and it becomes possible to increase the productivity of the wafer.

Example 1

An inspection device using a mirror electron microscope will be described with reference to FIG. 1. However, in FIG. 1, a vacuum exhaust pump or a control device thereof, an exhaust system piping, a transportation system of a wafer to be inspected, and the like will be omitted. In addition, a trajectory of the electron beam is exaggerated compared to the actual trajectory for the description.

First, a part related to electron beam irradiation will be described. An irradiation electron beam 100a emitted from an electron gun 101 is deflected by a separator 103 while being converged by a condenser lens 102 and is emitted as a substantially parallel electron beam flux toward a wafer 104 to be inspected. For the electron gun 101, a Zr/O/W type Schottky electron source which has a small light source diameter and can obtain a large current value is used, but an LaB6 electron source which can obtain a higher current value or an electron source, such as a cold cathode electron source having a high brightness may be used. Further, the electron gun 101 may be a magnetic field superposition type electron gun that arranges a magnetic lens in the vicinity of the electron source. Voltage and current required for operation of the electron gun, such as an extraction voltage, an accelerating voltage of the extracted electron beam, and a heating current of the electron source filament of the electron gun 101, are supplied and controlled by an electron gun control device 105. In a case where a Schottky electron source or a cold cathode electron source is used as the electron source, the inside of the electron gun 101 needs to be maintained at an ultrahigh vacuum of $10^{-6}$ Pa or less, and thus, a vacuum valve for the vacuum maintenance is provided during the maintenance or the like.

Although the condenser lens 102 is illustrated as one lens in the drawings, an electron optical system may include a plurality of lenses and multipoles so as to obtain an irradiation electron beam with higher parallelism. The condenser lens 102 is adjusted such that the electron beam is focused on a back focal plane of an objective lens 106. The objective lens 106 is an electrostatic lens configured with a plurality of electrodes or a magnetic lens.

The separator 103 is installed to separate the irradiation electron beam directed toward the wafer 104 to be inspected and the mirror electron beam that returns from the wafer 104 to be inspected. In the present example, a separator using an EXB deflector is used. The EXB deflector can be set so as to deflect the electron beam coming from the upper side and to make the electron beam coming from below go straight. In this case, as illustrated in the drawing, an electron optical column for supplying the irradiation electron beam is inclined, and the electron optical column for making an image of the reflected electrons stands upright. In addition, as a separator, it is also possible to use a deflector using only a magnetic field. A magnetic field is installed in a direction perpendicular to an optical axis of the electron beam, the irradiation electron beam is deflected in a direction of the wafer 104 to be inspected, and the electrons from the wafer 104 to be inspected are deflected in a direction completely opposite to the direction in which the irradiation electron beam comes. In this case, an optical axis of an irradiation electron optical column and an optical axis of an imaging electron optical column are arranged symmetrically with respect to the optical axis of the objective lens.

In a case where it is necessary to correct the aberration occurring when an irradiation electron beam 100a is deflected by the separator, an aberration corrector may be additionally installed. In addition, in a case where the separator 103 is a magnetic field deflector, correction is performed by providing an auxiliary coil.

The irradiation electron beam 100a deflected by the separator 103 is formed into an electron beam having a parallel flux which is perpendicularly incident on the surface of the wafer 104 to be inspected by the objective lens 106. As described above, since the irradiation system condenser lens 102 is adjusted such that the electron beam is focused on a back focal point 100b of the objective lens 106, the wafer 104 to be inspected can be irradiated with an electron beam having high parallelism. The region on the wafer 104 to be inspected irradiated with the irradiation electron beam 100a has an area of, for example, 10000 µm² or the like. The objective lens 106 has an anode for lifting mirror electrons above the surface of the wafer 104 to be inspected.

A wafer holder 109 is installed via an insulating member on a movement stage 108 controlled by a movement stage control device 107, and the wafer 104 to be inspected is placed thereon. A driving method of the movement stage 108 is two rectilinear motions orthogonal to each other, a rotational motion around the center of the wafer 104 to be inspected, a rectilinear motion in a radial direction of the wafer, or a combination the motions. In addition to the motions, a rectilinear motion in an up-down direction and a motion in an inclination direction may be added. By the motions, the movement stage 108 positions the entire surface or a part of the surface of the wafer 104 to be inspected on the electron beam irradiation position, that is, on the electron optical axis of the objective lens 106.

In order to form a negative potential on the surface of the wafer 104 to be inspected, a high-voltage power source 110 (negative voltage applying power source) applies a negative voltage which is substantially equal to the accelerating voltage of the electron beam to the wafer holder 109. The irradiation electron beam 100a is decelerated in front of the wafer 104 to be inspected by the retarding electric field formed by the negative voltage applied to the wafer holder 109 (sample support member). The negative voltage applied to the wafer holder 109 is finely adjusted such that an electron trajectory is inverted in the opposite direction before colliding with the wafer 104 to be inspected. The electrons reflected by the wafer are mirror electrons 100c.

The mirror electrons 100c are focused by the objective lens 106 or other imaging lenses and are converted into image signals by being projected onto the imaging element. Since the separator 103 is the EXB deflector in the present example, it is possible to control the electron beam that travels from below not to be deflected, the mirror electrons 100c go straight in a direction of the imaging system column that stands upright, and a first image that corresponds thereto is sequentially formed by an intermediate electron lens 111 and a projection electron lens 112.

The intermediate lens 111 and the projection lens 112 are electrostatic or magnetic lenses. The final electron image is enlarged and projected onto an image detecting unit 113. In FIG. 1, the projection electron lens 112 is drawn as one electron lens, but there is also a case where the projection electron lens 112 is configured with a plurality of electron lenses or multipoles for enlargement at a high magnification and correction of image distortion. Although not illustrated in the drawing, a deflector, astigmatism corrector and the like for adjusting the electron beam more specifically are provided as necessary.

An ultraviolet ray from the ultraviolet ray source 113 is dispersed by a spectroscope 114 and emitted toward the wafer 104 to be inspected by an ultraviolet optical element 115. Since the wafer 104 to be inspected is held in a vacuum, an atmosphere side and a vacuum side are separated from each other by a window made of a material (for example, quartz) that transmits the ultraviolet ray, and the ultraviolet ray emitted from the ultraviolet optical element 115 is irradiated through the window. Otherwise, the ultraviolet ray source 113 may be installed in a vacuum. In this case, it is also possible to use a solid-state element that emits ultraviolet light having a specific emission wavelength or the like without selecting wavelength selection by the spectroscope 114. The irradiation wavelength of the ultraviolet ray is, for example, a wavelength that corresponds to energy greater than a band gap of a wafer material. Otherwise, depending on the situation of an energy level within the band gap of the material, there is also a case where a wavelength of energy smaller than the energy of the band gap is selected as the wavelength for generating carriers in a semiconductor material. The ultraviolet ray is transmitted between the ultraviolet ray source 113, the spectroscope 114, and the ultraviolet optical element 115 by an optical fiber or the like. Otherwise, the ultraviolet ray source 113 and the spectroscope 114 may be integrated. In addition, in a case where the ultraviolet ray source 113 can be provided with a filter that transmits only a specific range of wavelengths, there is also a case where the spectroscope 114 is not used.

An image detecting unit 116 (imaging element) converts the image of the mirror electrons 100c into the electric signal and sends the electric signal to a defect determining unit 117. As an example, there is a case where the image detecting unit 116 includes a fluorescent plate for converting the electron beam into visible light and a camera for imaging the electron image of the fluorescent plate, and as another example, there is a case where the image detecting unit 116 includes a two-dimensional detector, such as a CCD element for detecting the electrons, and the like. A mechanism for multiplying the intensity of the electron image or the intensity of fluorescence may be provided.

The mirror electron image of each place on the surface of the wafer 104 is output from the image detecting unit 116 while driving the movement stage 108.

Operating conditions of various parts of the device, including the conditions of the above-described CCD imaging operation, are input and output from an inspection device control unit 118. In the inspection device control unit 118, various conditions, such as accelerating voltage at the time of electron beam generation, electron beam deflection width and deflection speed, stage moving speed, timing of capturing an image signal from the image detecting element, ultraviolet irradiation conditions, and the like, are input in advance, and the movement stage control device 107, an electron optical system control device 119 for controlling each electron optical element, a control system of the ultraviolet ray source 113 or the spectroscope 114, and the like, are controlled in a comprehensive manner. There is also a case where the inspection device control unit 118 is configured with a plurality of computers shared by roles and coupled via a communication line. Further, a monitor-equipped input and output device 120 is installed, and a user adjusts the inspection device, inputs the operation conditions, executes the inspection, and the like.

When a command to execute the inspection is input from the user from the monitor-equipped input and output device 120, the movement stage 108 is driven and an inspection start position specified on the wafer 104 moves immediately under the center of the objective lens 106. After the mirror electron image is acquired by the image detecting unit 116, the movement stage 108 is moved only by a set value, the next mirror electron image is imaged, and after this, this operation is repeated until reaching an imaging position set at an inspection completing position. Although there is also a case where the operation is repeated until the imaging of substantially the entire surface of the wafer 104 is completed, there is also a case where, after inspecting a certain area of the wafer 104 and moving to another place, the inspection of a certain area is started again.

Next, the detection principle of the work-affected region (latent flaw) remaining on the SiC wafer surface by the mirror electron microscope will be described with reference to FIG. 2. In the present example, detection is performed by utilizing a charging phenomenon of the work-affected region by the ultraviolet irradiation. FIG. 2(a) schematically illustrates the situation of a section of the wafer surface when not being irradiated with the ultraviolet ray. (1) is a case where the work-affected region exists below a flat surface, and in the drawing, a triangle-shaped work-affected region is illustrated as an example. Since there is no unevenness on the surface in the case, the detection is not performed by the optical methods of the related art. (2) is a case where there is a concave shape, such as a scratch, on the surface, and further, the work-affected region remains inside thereof. (3) is a case where a concave shape exists on the surface, but the internal work-affected region is not caused. In the case if (2) and (3), the work-affected region can be detected by an optical method in a case where the width of the concave is wider than a diffraction limit, but the presence or absence of the internal work-affected region cannot be distinguished. The wafer surfaces are illustrated matching the quipotential surfaces on which irradiated electrons are inverted. Since the case of (1) has no local charging or surface unevenness, the equipotential surface is flat. Although the cases of (2) and (3) have no local charging, there is a concave on the surface, and thus, the equipotential surface is also concave along the shape of the surface.

Changes in potential when a defect location is irradiated with the ultraviolet ray are illustrated in FIG. 2(b) as an example. As a wavelength of the ultraviolet ray to be emitted, a wavelength which is shorter than the wavelength that corresponds to the band gap energy of the wafer material (3.4 eV in a case of 4H—SiC usually used for the wafer) is appropriate. When the location is irradiated with the ultraviolet ray, the carriers are generated inside up to the depth where the ultraviolet ray can transmit. In a case of an n-type semiconductor, the electrons are trapped in the work-affected region and are locally negatively charged.

The equipotential surface in the drawing illustrates a situation where the work-affected region is negatively charged. In a case of (1), a local negatively charged region is generated, and when the equipotential surface is raised up, a convex shape is achieved. In a case of (2), although the surface is concave, a raising effect by the negative charging becomes higher, and the equipotential surface also becomes convex. In a case of (3), since there is no region to be charged, the equipotential surface remains in a concave shape regardless of the presence or absence of the ultraviolet irradiation.

In the mirror electron microscope, the unevenness on the above-described equipotential surface is converted into brightness and darkness and imaged. The principle will be outlined with reference to FIG. 3. FIG. 3(a) schematically illustrates an aspect in which the trajectory of the irradiated electrons is inverted in a case where the surface has unevenness. The equipotential surface is deformed in accordance with the surface shape. In the mirror electron microscope, the sample surface is irradiated with the irradiation electron beam being substantially parallel thereto, and the trajectory is inverted on a certain equipotential surface. In a case where the surface is concave and the equipotential surface is concave, the electron beam is inverted so as to converge. Meanwhile, in a case where the surface is convex and the equipotential surface is swollen, the trajectory of the electron beam is inverted so as to diverge.

The electrons of which the trajectory is inverted form an electron image by the objective lens. By shifting a focus surface of the objective lens from the sample surface, it is possible to display the unevenness of the equipotential surface as brightness and darkness of the electron image. In FIG. 3, the focus surface is set above the surface as indicated by the dotted line. In this case, in a case where the equipotential surface is concave and the trajectory is inverted while the electron beams converge, the electron beam concentrates on the focus surface and appears as a bright point in the electron image. Meanwhile, in a case where the equipotential surface is swollen and the trajectory is inverted while the electron beams diverge, the electron density decreases on the focus surface and appears in the electron image as a dark part.

When the optical condition is set such that the focus surface is virtually set below the sample surface, contrary to the case of FIG. 3, when the equipotential surface is convex, the contrast becomes bright, and when the equipotential surface is concave, the contrast becomes dark, and the electron image appears. Further, as illustrated in FIG. 3(b), even in a case where a locally positively or negatively charged region exists even when there is no unevenness on the surface, the equipotential surface is concave or swollen, and thus, similar to the unevenness of the surface, the equipotential surface appears in the electron image as brightness and darkness of the image. In addition, although the example in which the position of the focus surface is adjusted by the objective lens has been described, the focus of the objective lens may be fixed and a focusing condition may be adjusted by the intermediate electron lens or the projection electron lens at the subsequent stage.

When using the phenomenon in FIG. 2 and the mirror electron image formation principle in FIG. 3, it is possible to detect the work-affected region (latent flaw) in the mirror electron microscope image. Scratches without the work-affected region are scratches concave in shapes, and the equipotential surfaces are concave even under the ultraviolet irradiation. Meanwhile, it is considered that the formation of convex-shaped scratches is hardly observed after the CMP polishing, and there is a high possibility that the contrast indicating scratches with the equipotential surface bulging is a latent flaw.

For example, in a case of a flat latent flaw as illustrated in FIG. 2(a), in a state without irradiation with the ultraviolet ray, the latent flaw does not appear as brightness and darkness in the mirror electron image, but when being irradiated with the ultraviolet ray, the equipotential surface is swollen and the situation (2) of FIG. 3(b) is achieved, and the latent flaw appears as a dark contrast in the mirror electron image. In other words, when a dark contrast is detected while being irradiated with the ultraviolet ray, by giving a change, such as stopping the ultraviolet irradiation or decreasing intensity, to the ultraviolet irradiation condition, the dark contrast disappears or becomes thin, and at this time, the latent flaw can be determined.

However, in a case where the damage of the crystal in the work-affected region is extremely large and the trapped electrons cannot escape, the charging is maintained even when the ultraviolet irradiation condition is changed, and there is also a case where the contrast of the mirror electron image does not change. In any case, the region of the scratch where the equipotential surface is convex under the ultraviolet irradiation may be determined as a work-affected region (latent flaw).

Hereinafter, a flow of an inspection operation by the mirror electron microscope inspection device based on the above-described principle is illustrated in FIG. 4. Each of the electron optical elements (the electron gun 101, the condenser lens 102, the separator 103, the objective lens 106, the intermediate electron lens 111, and the projection electron lens 112) of the inspection device, the image detecting unit 116, the ultraviolet irradiation system and the like are set to be in a condition adjusted in advance.

First, in step of "input inspection condition" of (1), the user designates an inspection region on the wafer. On the monitor-equipped input and output device 120, in addition to a map display of the inspection region, a predicted number of the captured images and a predicted value of the total inspection time are displayed, and it is considered that the user can set the inspection condition with high efficiency. Various conditions concerning the inspection region created by the user, the order of inspection execution, and the like are stored in the inspection device control unit 118, and the user can execute the same inspection operation with respect to a plurality of wafers by calling the conditions. When the inspection conditions are determined, the user commands the start of the inspection operation via the monitor-equipped input and output device 120. When receiving the command, the inspection device control unit 118 starts loading the wafer onto the device.

In step of "wafer load operation" of (2), the wafer 104 to be inspected designated by the user is placed on the wafer holder 109, and the wafer holder 109 is installed on the movement stage 108 in the device. After this, the movement stage 108 moves to a position designated in advance by the user. In addition, the negative potential stored in the inspection device control unit 118 is applied to the wafer holder 109 by the high-voltage power source 110. Among the configuration elements of the objective lens 106, regarding the anode for forming an electric field above the wafer 104, in some cases, it is possible to reduce the risk of discharging by applying the negative potential in this step.

In step of "adjust imaging condition" of (3), the movement stage 108 moves to the wafer position at which the imaging condition adjustment is performed, which is designated by the user or registered in the inspection device control unit 118. The position is irradiated with the electron beams and the ultraviolet ray. The ultraviolet irradiation may be initiated by turning on the light source, or may be executed by installing a shutter and opening the shutter. The irradiation of the electron beam is executed by releasing blanking (not illustrated) or by opening a vacuum valve of the electron gun 101. The mirror electron image is captured by the image detecting unit 116 and displayed on the monitor-equipped input and output device 120. While viewing the displayed mirror electron image, the user adjusts the supply negative voltage value to the wafer holder 109 and other electron optical conditions when necessary.

In step of "search for work-affected region" of (4), by moving to the inspection start position set by the user in step (1), in accordance with imaging coordinates input in step (1), while moving by the control from the movement stage control device 107, the mirror electron image is acquired by the image detecting unit 116. The conditions of the electron optical element necessary for acquiring the mirror electron image are maintained by the electron optical system control device 119 at all times. The mirror electron image is analyzed by the defect determining unit 117 at all times, and it is determined whether or not the streaky mirror electron image contrast is detected.

In step of "determine work-affected region" of (5), in a case where the contrast of the streaky mirror electron image is detected in step (4), the movement stage 108 is stopped and it is determined whether or not there is the work-affected region (or the type of defect). According to the above-described basic principle, first, the determination is executed according to which one of the concave and the convex of the equipotential surface is indicated by the contrast indicating the scratch. In the n-type 4H—SiC wafer, in a case where the equipotential surface is concave along the scratch, it is assumed that there is no work-affected region as the first determination. In a case where the equipotential surface is convex along the contrast, it is assumed that the work-affected region exists as a first determination. Furthermore, the determination may be executed by changing the irradiation condition of the ultraviolet ray (second determination).

By evaluating the change in mirror electron image due to the change in ultraviolet irradiation condition, the degree of crystal damage in the work-affected region is determined. The ultraviolet irradiation condition is changed such that the amount of carriers excited inside the SiC decreases. For example, the irradiation itself is stopped, the irradiation intensity is reduced, the wavelength of the ultraviolet ray is made longer, and the like.

FIG. 5 illustrates a typical example of the change in mirror electron image depending on the degree of crystal damage. FIG. 5(*a*) is a view illustrating a mirror electron image in which the equipotential surface is determined to be convex. Since the image is acquired on the focus surface illustrated in FIG. 3, when the equipotential surface is convex, the density of the electron beam on the focus surface decreases and appears dark. FIG. 5(*b*) is a view illustrating an example of the mirror electron image when the ultraviolet irradiation condition is changed so as to reduce the amount of carriers generated in the 4H—SiC wafer.

A mirror electron image 1 is a case where the contrast is inverted. Since the surface shape is concave and the amount of crystal damage of the work-affected region is small, the ability to maintain the charging is low, and as the supply of the carrier decreases, the charging is eliminated soon, and as illustrated in (2) of FIG. 2(*a*), the equipotential surface will follow the surface shape.

A mirror electron image 2 is a case where the contrast disappears. Since the surface shape is flat and the amount of crystal damage of the work-affected region is small, the ability to maintain the charging is low, and as the supply of the carrier decreases, the charging is eliminated soon, and as illustrated in (1) of FIG. 2(*a*), the equipotential surface becomes flat following the surface shape.

A mirror electron image 3 is a case where the ability to maintain the charging is kept to a certain extent because of the relatively large amount of crystal damage in the work-affected region and the charged electric charge does not disappear instantaneously and gradually decreases.

The mirror electron image 4 is accompanied by the work-affected region having large crystal damage, and strongly holds the charging even when the supply of the carrier is stopped. Depending on the degree of the change in mirror electron images, the state of the work-affected region is classified. The examples given here are typical examples and can also be further classified according to the needs of users. In addition, by specifying the type of defect to be tracked of the affected region as will be described later in advance and by selectively performing the tracking when the specified defect is detected, it becomes possible to realize a high throughput of the inspection process without performing unnecessary inspection.

When the determination of the presence or absence of the work-affected region is completed, the position of the movement stage, the determination result of the work-affected region classification, and the like are recorded in the inspection device control unit 118, and the process shifts to the measurement of the total length of the next work-affected region.

In step of "track work-affected region" of (6), the total length of the work-affected region is measured with the position (stage coordinates) specified in step (4) as a base point. With reference to FIG. 6, a method of tracking the work-affected region will be described. FIG. 6(*a*) schematically illustrates the contrast accompanying the work-affected region in step (5). From the image, three feature points illustrated in FIG. 6(*b*) are extracted. One of the three points is the representative point (Xi, Yi) representing an image capturing position. (Xi, Yi) is a current stage position and can be defined as image center coordinates. The remaining two points are a point A (Xa, Ya) and a point B (Xb, Yb) where the contrast deviates from the image (outermost circumferential pixel position of the image where the linear part is located). By the image processing, pixels at locations where the contrast deviates from the image are extracted and converted into coordinates on the wafer in consideration of the magnification of the electron optical system. The image is referred to as "start point image".

When the contrast in FIG. 6(*a*) is detected, the point from the contrast point A (linear part that does not appear in the image) and the point from the point B are tracked. In FIG. 7, as an example, a case of starting the tracking before the point A (part of the linear part included in the image) is illustrated. After storing the image coordinates (Xi, Yi), the movement stage 108 is moved to the coordinates of the point A extracted in FIG. 6(*b*). The mirror electron image after the movement is imaged and the image coordinates (Xi, Yi) are updated and stored at destination coordinates (that is, the coordinates (Xa0, Ya0) of a point A0). Next, for the new image, the coordinate point of a point A1 (Xa1, Ya1) which is the position where the linear part deviates from the image is calculated. Thereafter, similarly, the movement stage is moved to (Xa1, Ya1), and a point A2 (Xa2, Ya2) where the linear part deviates from the image is calculated from the captured image acquired at the new position. The above-described processing is repeated until the linear part discontinues. When an image in which the contrast discontinues (terminal end point image (FIG. 7)) is obtained, a point AX (XaX, YaX) which is a position of a terminal end is calculated by image analysis.

The movement amount between each of the point A0, the point A1, the point A2, . . . , and the point An that are obtained as described above is integrated, and a tracking length L1 is obtained by further adding a distance between the point An (Xan, Yan) which is the center coordinates of the terminal end point image and the point AX which is the terminal end position. The movement stage returns to the position of the start point image, and now, the tracking in the opposite direction is started. FIG. 8 illustrates the tracking process. A point B0 (Xb0, Yb0) where the contrast deviates from the image in the start point image is calculated by image analysis, the movement stage 108 is moved to the position, and the mirror electron image is imaged. Hereinafter, similar to the method described in FIG. 7, the contrast is tracked as indicated by the point B0, the point B1, the point B2, and . . . , and the coordinates (Bn) of the center of the image (terminal end point image) in which the terminal end point appears are obtained. The movement amount between each of the point B0, the point B1, the point B2, . . . , and the point Bn is integrated, and a tracking length L2 is obtained by adding a distance between the point Bn (Xbn, Ybn) which is the center coordinates of the terminal end point image and the point BX which is the terminal end position. A length of the work-affected region is calculated by calculating L1+L2+L3 from the L1 and L2 obtained as described above and the length L3 of the linear part included in the start point image obtained by the image processing. In a storage medium of an arithmetic processing unit included in the defect determining unit 117, the above-described arithmetic expression is stored in advance, and the above-described calculation is automatically executed. In addition, by storing the coordinate information of the point A0, the point A1, the point A2, . . . , and the point An, and the coordinate information of the point B0, the point B1, the point B2, . . . , the point Bn in the inspection device control unit 118, a map is displayed as will be described later. When the works are completed, returning to the position of the start point image, and returning to step (4) described in FIG. 4, the next contrast is searched for.

When the imaging of the mirror electron image of the inspection range set by the user is completed, the inspection device control unit 118 map-displays the position of the movement stage on which the work-affected region is imaged on the monitor-equipped input and output device 120. FIG. 9 illustrates a display example in a graphical user interface (GUI) of the monitor-equipped input and output device 120. Only the part that displays the map of the work-affected region is extracted and illustrated. In the GUI, the wafer size of the inspection contrast is displayed in a wafer size display column 121. The inspection result is displayed together with the outer shape of the wafer in a map display region 122. A search direction of the contrast set by the user is indicated by a search location display line 123. In the present example, it is illustrated that the search was performed in a vertical direction on the center of the wafer. FIG. 9 illustrates an example (latent flaw display 124) in which the tracking points when tracking the entire length in "track work-affected region" of step (6) are connected to each other by lines and ID numbers are assigned in the order of arrangement. In the latent flaw characteristic display column 125, symbols that correspond to the total length of the latent flaw for each ID number and defect types categorized by a difference in change due to the ultraviolet irradiation conditions as described in FIG. 5 are displayed.

According to the present example, in the inspection device using the mirror electron microscope, it is possible to obtain information on the length or distribution of the work-affected region (latent flaw) of the SiC wafer without inspecting the entire surface of the wafer.

Further, as illustrated in FIG. 5 as an example, since the brightness change amount of the linear part obtained by changing the ultraviolet irradiation condition changes depending on the degree of damage of the wafer, for example, a relational expression or a table which indicates a relationship between a brightness difference of the linear part before and after the change in ultraviolet irradiation condition and an index value of damage is created in advance, by substituting the brightness difference information obtained by undergoing the inspection process into the relational expression, the index value of damage may be calculated and displayed. By performing the display, an operator can perform quantitative evaluation of wafer damage.

FIG. 13 is a flowchart illustrating more specific processes of measuring the length of the latent flaw using the mirror electron microscope image. The processing contents illustrated in FIG. 13 as an example are stored in a predetermined storage medium as an operation program (recipe) for controlling the electron microscope. FIG. 14 is a view illustrating an example of a defect inspection system including an arithmetic processing unit 1403 having a storage medium (memory 1406) for storing a recipe for automatically executing a defect inspection. The system illustrated in FIG. 14 as an example includes: a mirror electron microscope 1400 including a mirror electron microscope main body 1401 and a control device 1402 that controls the mirror electron microscope; the arithmetic processing unit 1403 that supplies a signal for controlling the mirror electron microscope 1400 and processes an image signal obtained by the mirror electron microscope; an input unit that inputs necessary information or an input and output device 1410 that outputs inspection information; and a design data storage medium 1411 in which design data of a semiconductor wafer is stored, are included.

The arithmetic processing unit 1403 includes: a recipe executing unit 1404 that transmits an operation program stored in the memory 1406 to the control device 1402; and an image processing unit 1405 that processes the image signal acquired by the mirror electron microscope. The image processing unit 1405 includes: an image analysis unit 1407 that determines whether or not latent flaws and the like are included in the image data; a defect determining unit 1408 that outputs defect type information or the like that corresponds to the change in brightness when the ultraviolet irradiation condition changes based on the table or the arithmetic expression stored in advance; and an inspection necessity determining unit 1409 that determines whether or not to continue the inspection in which a position of a field of view has moved based on the defect determination. The image analysis unit 1407 identifies the dark portion and the bright portion, for example, based on binarization processing or the like of the image, and determines the shape and the like of the dark region or the bright region. In the shape determination, for example, in a case where a linear brightness displacement region that is long in a specific direction and narrow in width exists, the part is determined as a defect candidate. In addition, the inspection necessity determining unit 1409 evaluates the latent flaw, and for example, based on a determination as to whether or not a linear pattern indicating the latent flaw is positioned at the outermost circumferential pixel position of the image, it is determined whether or not to perform tracking inspection of the latent flaw or the direction of movement of the field of view and the like is determined.

An automatic inspection process will be described with reference to the flowchart illustrated in FIG. 13. First, a sample (SiC wafer in a case of the present example) is introduced into a vacuum sample chamber of the mirror electron microscope (step 1301). Next, the movement stage 108 is controlled based on the inspection position information stored in the recipe and the inspection target position is positioned at the irradiation position of the electron beam (step 1302). In a case of the inspection of the entire surface, the irradiation position of the electron beam is positioned so as to cover the entire region of the wafer. Next, as the positioned inspection position is irradiated with the ultraviolet ray and the electron beam, a first image of the sample in a state of being irradiated with the ultraviolet ray and a second image of the sample in a state of being irradiated with the ultraviolet ray of different irradiation conditions are acquired (step 1303). The image analysis unit 1407 determines whether or not the latent flaw is included in the obtained image signal (step 1304). In the determination whether or not the latent flaw is included, with respect to a region having a brightness different from that of other regions in the image, the change in brightness when the ultraviolet irradiation condition changes is evaluated, and in a case where the brightness change amount exceeds a predetermined value, the brightness displacement region is determined as a latent flaw. In addition, in accordance with the degree of brightness change, defect types may be categorized. In addition, in accordance with the pattern of contrast change before and after the ultraviolet irradiation, the determination whether or not the tracking inspection is performed may be performed.

In addition, in a case where the latent flaw that has already been evaluated is detected again, the stage is moved to the next inspection position without performing the reinspection. In the flowchart illustrated in FIG. 13 as an example, it is determined whether the inspection is skipped or the tracking inspection of the latent flaw is performed after confirming the existence of the latent flaw, but since the latent flaw information obtained by the tracking inspection that has already been performed is stored together with the coordinate information, based on the tracking inspection position information that has already been obtained, the inspection may be skipped.

In step 1304, in a case where it is determined that there is a latent flaw in the image and there is no end of the latent flaw in the image (there is a possibility that the latent flaw extends to the outside of the image), the inspection necessity determining unit 1409 determines to perform the tracking inspection of the latent flaw, and outputs a command for performing stage driving to the control device 1402 such that the end of the latent flaw expressed in the image is positioned at the center of the image (step 1305). In accordance with the command from the control device 1402, the movement stage is controlled such that the end (for example, the point A illustrated in FIG. 6) of the latent flaw is positioned at the center of the image, the electron microscope image before and after the UV irradiation is acquired, and the evaluation of the latent flaw is performed (steps 1306 and 1307). In the tracking process of the latent flaw, the latent flaw may be evaluated based on the image acquisition before and after the ultraviolet irradiation, and when simply performing only the tracking of the locus, evaluation of the latent flaw using the electron microscope image may be performed without changing the ultraviolet irradiation condition. By changing the irradiation conditions of the ultraviolet ray at each position and acquiring an image, although the type is the same latent flaw, in a case where the type of defect partially changes, it is possible to detect the change.

The processing as described above is performed until the end of the latent flaw is detected, and at the time when the detection of the two ends is further completed, the coordinate information of each of the positions, the defect type, the length information, the index value of the damage, and the like are registered in the memory 1406 as defect information (step 1308). After the detection of the latent flaw, in a case where an inspection target region remains, the movement stage is controlled so as to position the field of view at the next inspection position (step 1302), and the inspection is continued.

According to the electron microscope provided with the operation program as described above, it becomes possible to selectively perform the evaluation based on the image acquisition with respect to a location where the damage to the wafer is remarkable. In addition, since the latent flaw has a length of several mm to several tens of mm, the inspection is performed at predetermined intervals without inspecting the entire surface, and when the latent flaw is detected, the tracking inspection is supposed to be selectively performed, and the images of a plurality of connected fields of view may be acquired. By performing the inspection, it becomes possible to achieve both the efficiency of inspection and detection without omission of the latent flaw.

Example 2

In "track work-affected region" in step (6) in Example 1, tracking was performed by repeating the operation of moving the sample position that corresponds to the center of the image to an edge of the image. However, the method in which the movement amount per one time is approximately half of the image size, is simple as a tracking algorithm, but the number of times of imaging at tracking increases. Here, in the present example, in order to realize the efficiency of imaging, a method of changing the tracking movement direction is adopted according to at which edge of the image the linear brightness displacement part deviates.

The present example will be described with reference to FIG. 10. An image including the brightness displacement location found in the "search for work-affected region" of step (4) in FIG. 4 is schematically illustrated as a start point image. First, the position point A0 (Xa0, Ya0) deviating from the start point image is calculated. In this case, since the point deviates at a lower end of the start point image, the movement stage 108 is moved and the middle point of an upper end of the image becomes the position point A0. Next, since the point A1 (Xa1, Ya1) deviating from the image is a right end of the image, at this time, the movement stage 108 is moved such that the middle point of the left end of the image comes to the point A1. In this manner, in the brightness displacement location, when the movement stage is controlled such that the left end middle point of the next image comes to a position deviating at the right end, the right end middle point of the next image comes to a position deviating at the left end, the upper end middle point of the next image comes to a position deviating at the lower end, or the lower end middle point of the next image comes to a position deviating at the upper end, it is possible to efficiently track the scratch-like contrast without overlapping the images. Calculation of the total length of the scratch-like contrast and map-like display can be made the same as that in Example 1.

Example 3

Most of the brightness displacement locations (latent flaws) have a total length of several mm to several tens of mm while the image size (the field of view) of the mirror electron image is approximately 100 μm. Since the field of view is sufficiently small with respect to the total length of the latent flaw, the direction rarely changes largely in the image, and in the mirror electron image, mainly, there is a case where the latent flaw is mostly linear. In the present example, the number of tracking points is reduced by making approximately a straight line.

As illustrated in FIG. 11, the point at which the brightness displacement location deviates from the image, the point A0 (Xa0, Ya0), and the point B0 (Xb0, Yb0) are obtained in the start point image. From the coordinate values of the two points, a slope T of the brightness displacement location is obtained from T=(Ya0−Yb0)/(Xa0−Xb0).

The next imaging point Ac1 (Xac1, Yac1) is calculated using the slope T of the obtained brightness displacement location and the movement amount X set by the user based on (Xac1, Yac1)=(Xa0+ΔX, Ya0+T×ΔX). After the execution of the movement based on the movement amount obtained in this manner, the point where the scratch-like contrast deviates from the image, the point A1 (Xa1, Ya1), and the point B1 (Xb1, Yb1) are further obtained and the next movement amount is calculated in the same manner. The operation is repeated until the terminal end of the brightness displacement location appears in the image. The integration of the movement amounts of each of the tracking points and the difference between an image capturing point and the final end point are added up to be the length of the tracking part. Next, returning to the start point image again, the movement amount is tracked in the opposite direction as −ΔX. By adding the length of the tracking part in the right direction and in the left direction, the total length of the scratch-like contrast is achieved.

As the movement amount ΔX used in the present example increases, the number of times of imaging for tracking decreases, and more efficient tracking is possible, but there is also a risk of deviating from the image. It is desirable that the user considers and selects typical curvature of scratch-like contrast, characteristics of polishing process, and tracking efficiency. The settings are input by the user from the monitor-equipped input and output device 120. The display of the brightness displacement location tracking result can be the same as in Example 1.

Example 4

In the present example, in "search for work-affected region" in step (4) in FIG. 4, element region information is extracted from the design data of the wafer-like device pattern and only the region where elements, such as diodes or transistors, are formed as a search target. The design data is read out from the design data storage medium 1411 illustrated in FIG. 14 as an example, and in the recipe executing unit 1404, the movement condition of the movement stage is determined based on the design data and other inspection conditions input from the input and output device 1410. The design data stored in the design data storage medium 1411 is expressed in a GDS format, an OASIS format or the like, and is stored in a predetermined format. By the selection from the input and output device 1410, an arbitrary circuit group region can be extracted. FIG. 12 is a view illustrating an example of a search region setting screen displayed on a display device of the input and output devices 120 and 1410. Design patterns (circuit region 127) of the element overlap and are displayed on the wafer 126. In FIG. 12, the pattern is drawn as a square. The drawing does not illustrate a state where the pattern is actually formed, and is a view in which the pattern data of elements virtually overlap on a wafer before pattern formation.

The display example of FIG. 12 is a view illustrating an example in which a search trajectory (search line 128) is set at the center of a plurality of circuit regions 127. By performing the display, it becomes possible to set the search trajectory while confirming the positional relationship between the scratch on the base wafer and the circuit pattern which has a possibility of influence of the scratch on the base wafer. In the present example, the vertical dotted line set in the circuit region 127 is the search line 128, and by performing such setting in advance, in "search for work-affected region" of step (4), it is possible to image the mirror electron image along the search line 128 while moving the movement stage 108, and to search for the brightness displacement location. In the example of FIG. 12, the search line 128 is set as a vertical line, but according to the characteristics of the polishing process such as width or diagonal, a case where arbitrary setting is possible by the user may be achieved. For example, by displaying the wafer and the circuit region information extracted from the design data in combination on the GUI screen and by making it possible to set the start point and the end point of the search line at an arbitrary position on the display region, the search line can be set in view of the direction of the scratch formed by the polishing process for the region where the search line is supposed to be set. For example, it is desirable to set the search line in a direction orthogonal to the longitudinal direction of the latent flaw in order to find the latent flaws without omission.

The brightness displacement location is detected in step (4) along the search line 128, and in "track work-affected region" in step (6), in the methods of Examples 1 to 3, the tracking inspection of the latent flaw is executed. By overlapping the region information of the circuit pattern and the search line indicating the search trajectory, it is possible to set an efficient inspection condition without setting the search trajectory at a position which is not necessary.

In addition, in the description above, FIG. 12 has been described as an example of the setting screen for setting the inspection conditions, but an inspection result display screen on which the latent flaw information extracted based on the image information obtained by the electron microscope and the circuit pattern information overlap each other and are displayed may be employed. In this case, it becomes possible to visually evaluate the positional relationship between the circuit region and the latent flaw, and it becomes possible to determine whether or not the wafer is a wafer that can form the circuit pattern according to the design data. Further, the risk degree of the defect type may be stored in a database, and the latent flaw may be displayed in a color-coded manner in accordance with the detection result of the defect. In addition, when the influence of the defect on the circuit differs depending on the combination of the defect type and the type of the circuit or the like, the relevant information is stored in advance, and the influence degree of the obtained defect information and circuit information may be identified and displayed with reference to the relevant information.

REFERENCE SIGNS LIST

100*a*: irradiation electron beam
100*b*: back focal point
100*c*: mirror electron beam
101: electron gun
102: condenser lens
103: separator
104: wafer to be inspected
105: electron gun control device
106: objective lens
107: movement stage control device
108: movement stage
109: wafer holder
110: high-voltage power source
111: intermediate electron lens
112: projection electron lens
113: ultraviolet ray source
114: spectroscope
115: ultraviolet optical element
116: image detecting unit 117: defect determining unit
118: inspection device control unit
119: electron optical system control device
120: monitor-equipped input and output device
121: wafer size display column
122: map display region
123: search location display line
124: latent scratch display
125: latent flaw characteristic display column
126: wafer
127: design pattern of element
128: search line

The invention claimed is:

1. A defect inspection device comprising:
a sample support member that supports a sample irradiated with an electron beam emitted from an electron source;
a negative voltage applying power source for forming a retarding electric field with respect to the electron beam emitted toward the sample;
an imaging element at which an image of electrons reflected without reaching the sample is formed via the retarding electric field;
an ultraviolet light source that emits an ultraviolet light toward the sample;
a movement stage that moves the sample support member; and
a control device that controls the movement stage, wherein
the control device controls the movement stage such that a next image is taken from a portion of a linear part included in the image imaged by the imaging element or a location on an extensional line of the linear part, and repeats the control of the movement stage until an end of the linear part is positioned within the irradiated region of the electron beam.

2. The defect inspection device according to claim 1, wherein
the control device moves the movement stage such that the linear part positioned outside the image is included in an irradiated region of the electron beam in a case where it is possible to determine that the linear part is positioned outside the image.

3. The defect inspection device according to claim 1, wherein
the control device determines whether or not tracking of the linear part is performed based on two or more images obtained by changing the irradiation conditions of the ultraviolet light.

4. The defect inspection device according to claim 3, wherein
as a result of a predetermined change in linear location included in the two or more images, the control device controls the movement stage so as to perform the tracking of the linear part.

5. The defect inspection device according to claim 1, wherein
the control device moves the movement stage such that the end of the linear part is positioned at a predetermined position in the image.

6. The defect inspection device according to claim 1, wherein
the control device moves the movement stage in accordance with the position of the end of the linear part.

7. The defect inspection device according to claim 6, wherein
the control device moves the movement stage in a direction of a side of the image in which the linear end is positioned.

8. The defect inspection device according to claim 1, further comprising:
a display device that displays the image, wherein
on the display device, a search trajectory on the sample due to the movement of the movement stage and design data of a circuit formed on the sample overlap and are displayed.

9. The defect inspection device according to claim 1, wherein
the control device calculates a length of the linear part based on a plurality of images obtained based on repetition of movement of the movement stage.

10. A defect inspection method for generating an image of a sample and performing defect inspection using the image by emitting an electron beam toward the sample placed on a movement stage in a state where a retarding electric field for retarding the electron beam, and by detecting an electron reflected without reaching the sample by the retarding electric field,
wherein, in a state where the sample is irradiated with an ultraviolet light, the electron beam is emitted, a linear part included in the image obtained by the irradiation is specified, a next image is taken from a portion of the linear part included in the image imaged by the imaging element or a location on an extensional line of the linear part, the movement stage is moved, and the movement using the movement stage is repeated until an end of the linear part is positioned within the irradiated region of the electron beam so as to be positioned at a specific location in an irradiated region of the electron beam.

* * * * *